United States Patent
Thomas et al.

(10) Patent No.: US 10,074,925 B1
(45) Date of Patent: Sep. 11, 2018

(54) SYSTEM, CONNECTOR AND METHOD FOR PROVIDING ENVIRONMENTALLY DEGRADABLE ELECTRONIC COMPONENTS

(71) Applicant: LOCKHEED MARTIN CORPORATION, Bethesda, MD (US)

(72) Inventors: Toby D. Thomas, Southlake, TX (US); Caleb Santiago, Winter Haven, FL (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 851 days.

(21) Appl. No.: 14/180,800

(22) Filed: Feb. 14, 2014

Related U.S. Application Data

(60) Provisional application No. 61/764,806, filed on Feb. 14, 2013.

(51) Int. Cl.
  *H01R 13/46* (2006.01)
  *F42D 5/04* (2006.01)
  *H05K 1/02* (2006.01)
  *F42B 33/06* (2006.01)

(52) U.S. Cl.
  CPC .............. *H01R 13/46* (2013.01); *F42B 33/06* (2013.01); *F42D 5/04* (2013.01); *H05K 1/0275* (2013.01); *H05K 2203/178* (2013.01)

(58) Field of Classification Search
  CPC ........... F42B 33/06; F42D 5/04; H01R 13/46; H05K 2203/178; H05K 1/0275
  See application file for complete search history.

(56) References Cited

U.S. PATENT DOCUMENTS

| | | | | |
|---|---|---|---|---|
| 4,875,950 A | * | 10/1989 | Waldock | C06B 23/001 149/2 |
| 5,736,669 A | * | 4/1998 | Thomas | B09C 1/10 102/293 |

(Continued)

FOREIGN PATENT DOCUMENTS

| | | |
|---|---|---|
| CN | 102838784 | 12/2012 |
| WO | 2007/073109 | 6/2007 |

(Continued)

OTHER PUBLICATIONS

Sauter et al., "Storage, Mobilization, and Interrelations of Starch, Sugars, Protein, and Fat in the Ray Storage Tissue of Poplar Trees", Trees vol. 8, pp. 297-304 (1994).*

(Continued)

*Primary Examiner* — Scott R Walshon
(74) *Attorney, Agent, or Firm* — Terry M. Sanks, Esq.; Beusse Wolter Sanks & Maire, PLLC

(57) ABSTRACT

A connector including a biodegradable base material and a biodegradable binder material, comprising at least one of a protein and a residue, configured to hold together the base material to form a biodegradable connector element. The biodegradable connector element affects an operational condition of an apparatus the biodegradable connector element is used within. Degradation of at least one of the biodegradable base material, the biodegradable binder, and the biodegradable connector element provides for a limited operational lifespan of the apparatus resulting in the apparatus becoming inoperable. A system is also disclosed.

19 Claims, 3 Drawing Sheets

(56) References Cited

U.S. PATENT DOCUMENTS

| | | | |
|---|---|---|---|
| 6,114,164 A * | 9/2000 | Dennis | C12M 35/02 435/284.1 |
| 6,703,660 B2 * | 3/2004 | Yitzchaik | B82Y 10/00 257/315 |
| 6,880,290 B2 * | 4/2005 | Mahoney | A01K 69/00 43/100 |
| 7,565,929 B2 | 7/2009 | Bustos et al. | |
| 7,686,629 B1 | 3/2010 | Yu et al. | |
| 8,113,290 B2 | 2/2012 | Sharma et al. | |
| 8,585,841 B2 * | 11/2013 | Lubbe | C06B 21/005 149/108.2 |
| 8,850,984 B2 * | 10/2014 | Smylie | A62D 3/02 102/301 |
| 2010/0018106 A1 * | 1/2010 | Philbrook | A01K 69/10 43/105 |
| 2011/0053255 A1 * | 3/2011 | Smylie | C06B 21/0091 435/262.5 |
| 2011/0056702 A1 | 3/2011 | Sharma et al. | |
| 2011/0155500 A1 * | 6/2011 | Smylie | A62D 3/02 181/116 |
| 2011/0158455 A1 | 6/2011 | Kim et al. | |
| 2011/0319978 A1 * | 12/2011 | Schaffer | A61L 31/022 623/1.15 |
| 2012/0053319 A1 * | 3/2012 | Reguera | C07K 14/195 530/324 |
| 2012/0223293 A1 | 9/2012 | Borenstein et al. | |

FOREIGN PATENT DOCUMENTS

| | | | | |
|---|---|---|---|---|
| WO | WO 2010144016 A1 * | 12/2010 | | A61B 5/04001 |
| WO | WO-2013113058 A1 * | 8/2013 | | C06B 21/0091 |

OTHER PUBLICATIONS

Tlustos et al., "Exploitation of Fast Growing Trees in Metal Remediation", M. Mackova et al. (eds.), Phytoremediation Rhizoremediation, Springer Books pp. 83-102 (2006).*

* cited by examiner

US 10,074,925 B1

SYSTEM, CONNECTOR AND METHOD FOR PROVIDING ENVIRONMENTALLY DEGRADABLE ELECTRONIC COMPONENTS

CROSS-REFERENCE TO RELATED APPLICATIONS

This application claims the benefit of U.S. Provisional Application No. 61/764,806 filed Feb. 14, 2013, and incorporated herein by reference in its entirety.

BACKGROUND

In the electronics industry, a key design goal with respect to electrical components has long been to build devices that last forever, while providing a completely stable performance. This design goal has even existed for electronic systems which are intended to have a short life due to intended destruction of the electronic system. As an example, many of the devices utilized in some weapon systems, particularly in weapon payloads, are only needed temporarily. When used in weapon payloads, electronic equipment such as sensors or electronically controlled ordnance may be dispersed on a battlefield.

In the consumer market, with advances in technology which not only has improved capabilities of systems utilizing electronic components (such as computers, cell phones, etc.), but also reducing the cost of the components and hence the systems, older systems and devices are discarded as consumers obtain newer and improved devices and systems. Depending on the type of system or device, many end up being discarded in landfills wherein the electrical components, including connectors may not degrade for a number of years.

Manufacturers and users of electronic equipment would realize logistics and safety advantages if electronic equipment disintegrates over time when exposed permanently to the environment. Manufacturers and users of weapon systems would also realize advantages where no effort is required to recover and disable used weapon systems in order to deny access of the technology to an enemy. Additionally, benefits would be realized where no long term post battle danger to civilians or the environment is posed by used or abandoned weapon-related electronics.

BRIEF DESCRIPTION

Embodiments relate to a system, connector and method for providing for environmental degradable electronic components. The connector comprises a biodegradable base material and a biodegradable binder material, comprising at least one of a protein and a residue, configured to hold together the base material to form a biodegradable connector element. The biodegradable connector element affects an operational condition of an apparatus the biodegradable connector element is used within. Degradation of at least one of the biodegradable base material, the biodegradable binder, and the biodegradable connector element provides for a limited operational lifespan of the apparatus resulting in the apparatus becoming inoperable.

The system comprises an operational element within the system to cause the system to perform a function. The system also comprises a system element within the system configured to activate the operational element. The system also comprises at least one connector element providing for communication between the operational element and the system element, the connector element comprising a biodegradable base material, a biodegradable binder material, comprised of at least one of a protein and a residue, configured to hold together the base material and form the at least one connector element. Degradation of at least one of the biodegradable base material, the biodegradable binder, and the at least one connector element, caused by exposure to an operational environment of the system, provides for a limited operational lifespan of the apparatus resulting in the operational element becoming inoperable.

BRIEF DESCRIPTION OF THE DRAWINGS

A more particular description briefly stated above will be rendered by reference to specific embodiments thereof that are illustrated in the appended drawings. Understanding that these drawings depict only typical embodiments and are not therefore to be considered to be limiting of its scope, the embodiments will be described and explained with additional specificity and detail through the use of the accompanying drawings in which.

DETAILED DESCRIPTION

Figure 1:
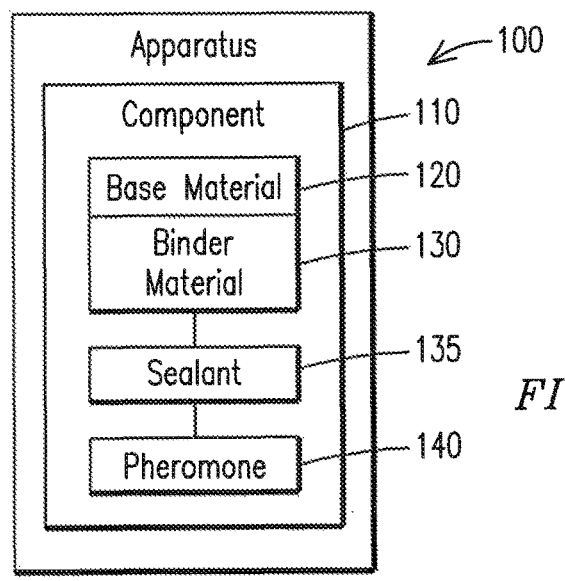
FIG. 1 shows a block diagram illustrating an apparatus or device.

Embodiments are described herein with reference to the attached figures, wherein like reference numerals, are used throughout the figures to designate similar or equivalent elements. The figures are not drawn to scale and they are provided merely to illustrate aspects disclosed herein. Several disclosed aspects are described below with reference to non-limiting example applications for illustration. It should be understood that numerous specific details, relationships, and methods are set forth to provide a full understanding of the embodiments disclosed herein. One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. The embodiments are not limited by the illustrated ordering of acts or events, as some acts may occur in different orders and/or concurrently with other acts or events. Furthermore, not all illustrated acts or events are required to implement a methodology in accordance with the embodiments.

Notwithstanding that the numerical ranges and parameters setting forth the broad scope are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. Furthermore, the term "at least one of . . . and . . . " is used herein. The use of this phrase is not meant to be limiting as it is intended to mean either all of the items are included or just one of them.

FIG. 1 shows a block diagram illustrating an apparatus or device with at least one component within the apparatus and parts included as parts of the component. As illustrated, the apparatus 100 may comprise at least one component 110. The at least one component 110 may comprise a biodegradable base material 120, a biodegradable binder material 130 configured to hold together the base material 120 and to operate as a sealant for the at least one component 110. As illustrated, the sealant 135 aspect of the binder material 130 may be a separate element. In a non-limiting example, the sealant 135 is applied as a covering to the combined base material 120 and binder 130. The component 110 may also comprise a pheromone 140 to attract fauna that are in an operational environment where the apparatus is deployed. With the apparatus 100 located in the operational environment, degradation of the at least one component 110 is initiated due to exposure to the environment which will cause the apparatus 100 to become inert. During the degradation, the pheromone 140 may be released to attract fauna to consume any remaining part of the at least one component 110. In a non-limited example, the consumption of the at least one component by fauna is not harmful to the fauna.

The term "component" as used herein is not meant to be limiting. As one non-limiting example disclosed further herein, the component 110 may comprise an electrical connector, which may comprise a male connector member (or first connector) and a female connector member (or second connector) which are configured to connect to each other. As another non-limiting example, at least one wire with rapid deteriorating electrically conductive material as disclosed herein. As yet another non-limiting example, at least two separate wires may be joined and/or bridged together where the bridge may be made of rapidly deteriorating electrically conductive material as disclosed herein. As disclosed further herein, the wires may be environmentally degradable.

The biodegradable base material 120 may comprise a plant fiber. Non-limiting examples of the plant fiber may include straw from the stems of barley, oats, rice, rye, wheat. Additional non-limiting examples may include long stalk fibers from flax, corn stalks, bamboo, canes, etc. The biodegradable binder 130, which may also operate as a sealant, may comprise at least one of a protein and a residue. Non-limiting examples of the at least one protein and residue comprise tree sap, shellac, egg whites, albumin, etc. An intended purpose of the binder 130 as the sealant is that it may be water resistant.

Shellac is a resin secreted by the female lac bug, on trees in the forests of India and Thailand. It is processed and sold as dry flakes, which are dissolved in ethyl alcohol to make liquid shellac. Shellac functions as a touch natural primer, sanding sealant, tanning-blocker, odor-blocker, stain, and high-gloss varnish. Liquid shellac has a limited shelf life, of approximately one (1) year.

Albumin is from a family of globular proteins, the most common of which is serum albumin. The albumin family consists of all proteins that are water-soluble, are moderately soluble in concentrated salt solutions, and experience heat denaturation. Albumins are commonly found in blood plasma, and are unique from other blood proteins in that they are not glycosylated. Substances containing albumins, such as egg white, are called albuminoids.

A rate of degradation of the at least one component is determinative by a composition of the biodegradable binder with the biodegradable base material and at least one condition of the operational environment.

The pheromone may be provided to attract fauna within an operation environment where the device is deployed to approach the device and to want to consume the device, at least the biodegradable components of the device. Thus, as a non-limiting example, the type of pheromone may comprise a scent trace. Another non-limiting example may comprise a releaser pheromone that cause an alteration in a behavior of a type of fauna which results in a desire to approach the device and consume it, as discussed above. The releaser pheromone may provide for a rapid response, but which may quickly degrade or a primer pheromone which may have a slower onset and a longer duration. Other non-limiting examples may include, but are not limited to, a signal pheromone which causes a short-term change in fauna, a trail pheromone to create a path which a certain fauna, such as, but not limited to, ants, may follow to the device, a sex pheromone which may suggest availability of an opposite sex of a type of fauna. In an embodiment, the plant fiber may naturally comprise characteristics to attract fauna. As a non-limiting example, crushed sugarcane stalks produced in the sugar-making process may provide for fauna consumable connectors. Thus, as used herein, the term "pheromone" includes a plant fiber which may already possess traits to attract fauna, independent of another additive.

Figure 2:
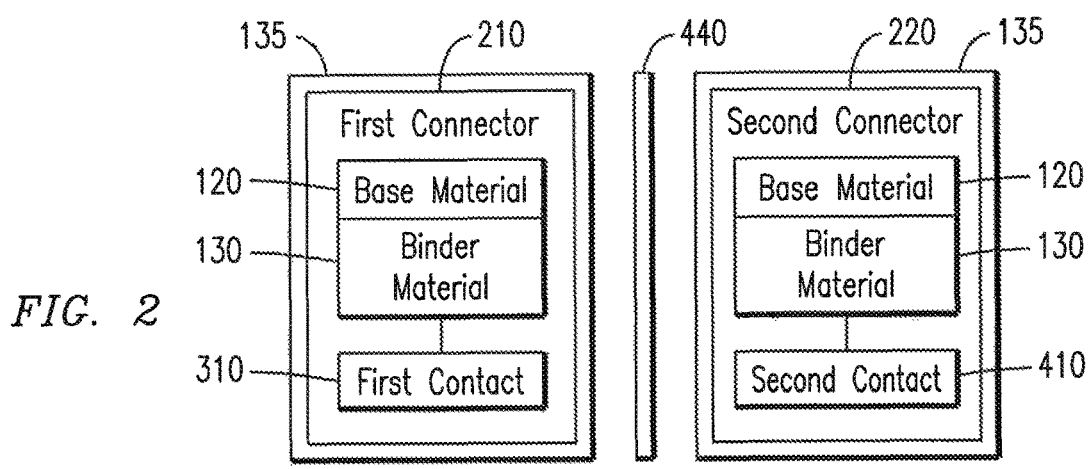
FIG. 2 shows a block diagram illustrating a degradable electronic component.

FIG. 2 shows a block diagram illustrating degradable electronic components. A first connector 210 and second connector 220 are disclosed. Each may comprise the base material 120 and the binder 130 to hold the base material together. As disclosed herein, the base material 120 and binder 130 may be a natural component/composition so that they may be able to decompose overtime when exposed to the elements (water, air, sunlight, and/or biological consumption).

Figure 3:
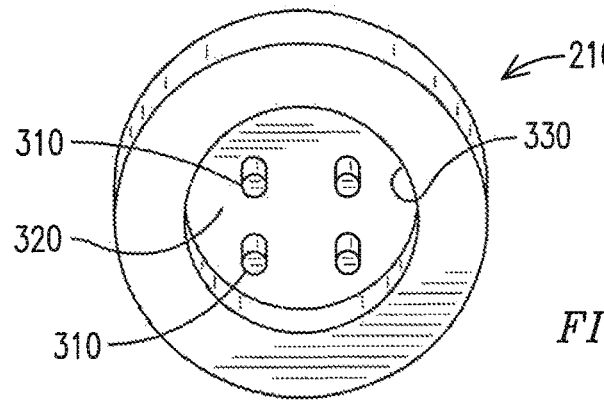
FIG. 3 shows a representation of a male connector.

FIG. 3 shows an illustration of a first connector. Though not limiting, the first connector may be considered a male connector. The male connector 210 may comprise finely stranded wire, such as, but not limited to, ultrafine stranded wire, with a tight twist as the male contact or plug 310. Utilizing ultrafine stranded wire provides for the wire to be environmentally degradable. Though a plurality of plugs 310 are illustrated, only one, or at least one may be provided. As illustrated, the male contacts 310 may extend from an inner shelf 320 within a body of the male connector 210.

Figure 4:
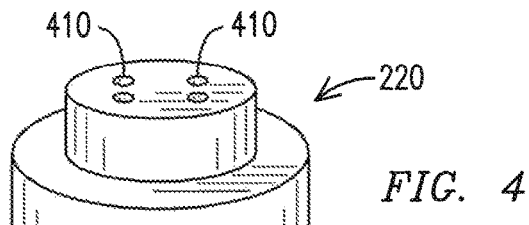
FIG. 4 shows a representation of a female connector.

FIG. 4 shows an illustration of a second connector. Though not limiting, the second connector may be considered a female connector. At least one female contact 410 of the female connector 220 may comprise individual thin bent metal plates, or sockets 410, rolled to fit tightly around individual male contacts 310. A body of the female connector 220 may be formed to fit, partially, or completely engaged, within an opening 330 ending at the inner shelf 320 of the male connector 210. In general, the first connector 210 and the second connector 220 are configured to connect together.

The wire and actual connection point on the male and female connectors (contacts as discussed above) are metal in order to conduct electricity. As such, these components are not biodegradable, but as disclosed are environmentally degradable, or simply degradable. Thus, metal used for at least one of contacts 310, 410 may be readily susceptible to rapid corrosion when exposed to the elements when in the operational environment. Non-limiting examples of the metal used in at least one of the contacts 310, 410 may comprise at least one of (and/or) copper and silver. In another non-limiting example, at least one of the contacts 310, 410 may comprise powdered metal and a conductive binder having properties similar to the conductive inks used for printed LED circuits.

Figure 5:
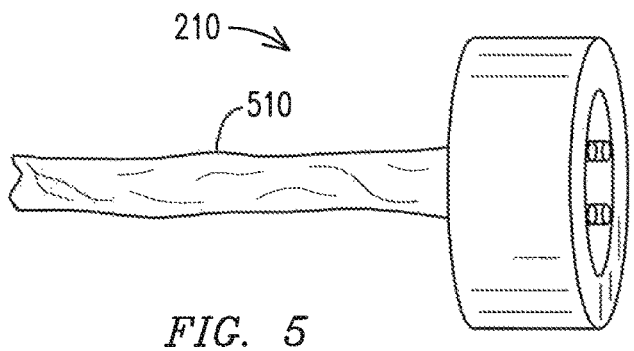
FIG. 5 shows an illustration of a side view of a connector.

As further illustrated in FIG. 5, when any wire, or metal, requires a conductive insulation, a biodegradable covering 510 may be used on such wires. A non-limiting example of the biodegradable covering or cover is paper 510. Thus, as illustrated, the wiring is covered.

As further illustrated in FIG. 1, the biodegradable binder 130 may be provided as a natural sealant. This may occur simply by combining the binder 130 with the base material 120, or by applying the binder 130 as an outer coating to the combined base material 120 and binder 130 which are combined as a compound. When applied separately as a sealant, the binder 130 may be applied either before or after the male and female contacts 210, 220 are connected together.

Once the binder 130 as the sealant is applied, it may be dried in a desiccator. In operation, once the binder 130 as the sealant is broken, such as, but not limited to, after the connectors are in use and have met their intended life cycle, the natural material of the connectors 310, 410 will begin to break down. A specific type binder 130 as the sealant used may be selected or determined based on a desired operational life, or longevity, of the connectors. In an embodiment, once the male connector 310 and female connector 410 are connected together, a securing compound 440, which may comprise a starch, may be applied to ensure the connectors 310, 410 do not separate prematurely.

Thus, as disclosed above, a connector may be provided which is a part of an apparatus that is deployable in an operational environment. The connector may comprise a male connector component and a female connector component which are configured to connect to each other. The connector may be provided to affect an operational condition of the apparatus, such as, but not limited to, ceasing to allow the apparatus to function. At least one of the connector components comprises a biodegradable base material and a biodegradable binder material, comprising at least one of a protein and a residue, configured to hold together the base material and to seal the at least one of the connector component. Degradation of at least one of the biodegradable base material and the biodegradable binder may provide for a limited operational lifespan of the apparatus before the apparatus becomes inert.

In another non-limiting embodiment at least one component of the apparatus comprises a biodegradable base material and a biodegradable binder material. The biodegradable binder material may comprise at least one of a protein and a residue, is configured to hold together the base material and is configured to operate as a sealant for the at least one component. A pheromone to attract fauna is also provided. When the apparatus is located in an operational environment degradation of the at least one component is initiated due to exposure to the environment, causes the apparatus to become inert, and said degradation releases the pheromone to attract fauna to consume any remaining part of the at least one component.

Figure 6:
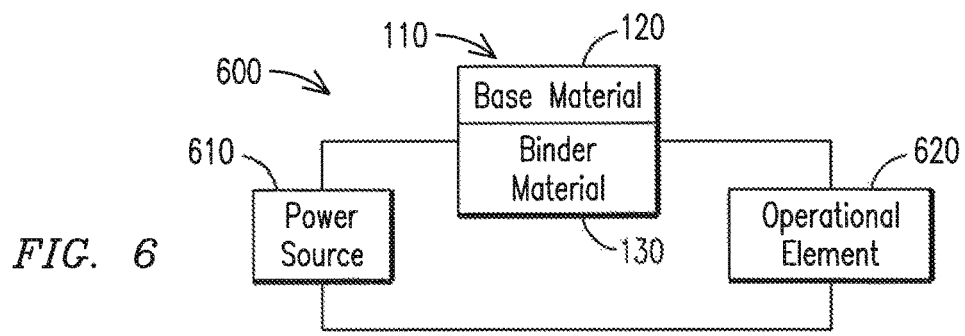
FIG. 6 shows an illustration of an electrical circuit with a degradable connection.

FIG. 6 shows an illustration of an electrical circuit where an electrical path for operation of the circuit may be opened by biodegradation functions as disclosed herein. As illustrated a power source 610 may be provided within the circuit 600. The power source 610 may be provided to deliver power for operation of an operational element 620 of the circuit 600. The component 110, as disclosed herein, may be provided to sever required communications, such as power, from reaching the operational element 620. As disclosed herein, the component 110 may comprise at least a single wire with rapid deteriorating electrically conductive material, at least two separate wires that are at least one of joined and bridged together where the at least one of joining and bridge may be made of rapidly deteriorating electrically conductive material. For illustration purposes only, this connector 110 is further illustrated in FIG. 6 to show the base material 120 and the binder material 130. Though FIG. 6 illustrates the degradation connector being between the power source 610 and the operational element 620, the degradation connector 110 may be located at any location within the circuit to ensure that the operational element is inoperable.

Figure 7:
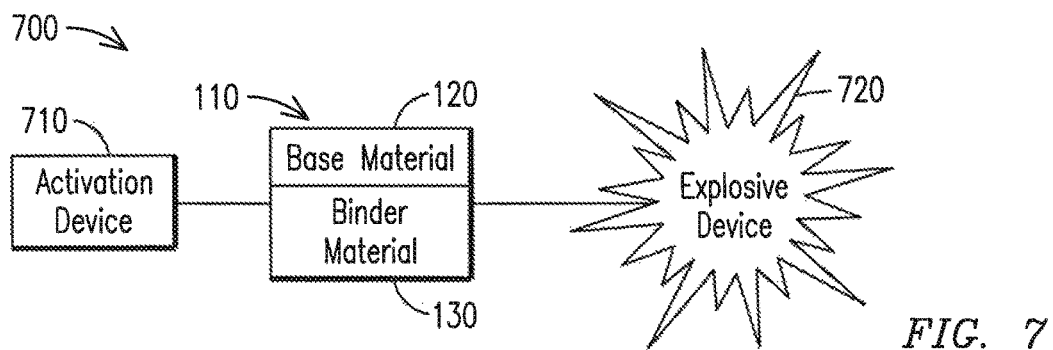
FIG. 7 shows an illustration of a system with an explosive component and a degradable connection.

FIG. 7 shows an illustration of a system with an explosive component in combination with an electrical path (from an igniter to the explosive) for operation with a portion configured to be opened by biodegradation functions described herein. This system 700 may comprise an activation device 710, such as, but not limited to, a fuse provided to initiate an explosive device 720. The biodegradable connector 110 is provided between a communication path of the activation device 710 to the explosive device 720. When degradation occurs, the explosive element or device 720 is rendered inoperative or inert.

Thus, when degradation occurs, the degraded section shall be configured to render the operational element 620 or the explosive device 720 inoperable to an extent that should a third party attempt to rewire the degraded communication line (wire), the operational element 620 or the explosive device 720 is still inoperable. This may be accomplished by use of the degradable wire described herein so that the wire at and within at least one of the operational element 620 and the explosive device 720 is also degraded beyond operational use, thus making the explosive device inert. Use of the environmentally degradable wire results in the explosive device or the activation device being further inert to an extent that once the wire is degraded, these components are not functional if removed and then included in another system, apparatus, or device.

As used herein, it is evident that the operational element may also comprise the explosive device. Therefore, these terms shall not be considered limiting as the operational element may comprise other elements within a system. Similarly, the use of apparatus and system may be used interchangeably. Also, though the terms activation device and power source are disclosed, both may be considered a system element which affects a function of the operational element.

Figure 8:
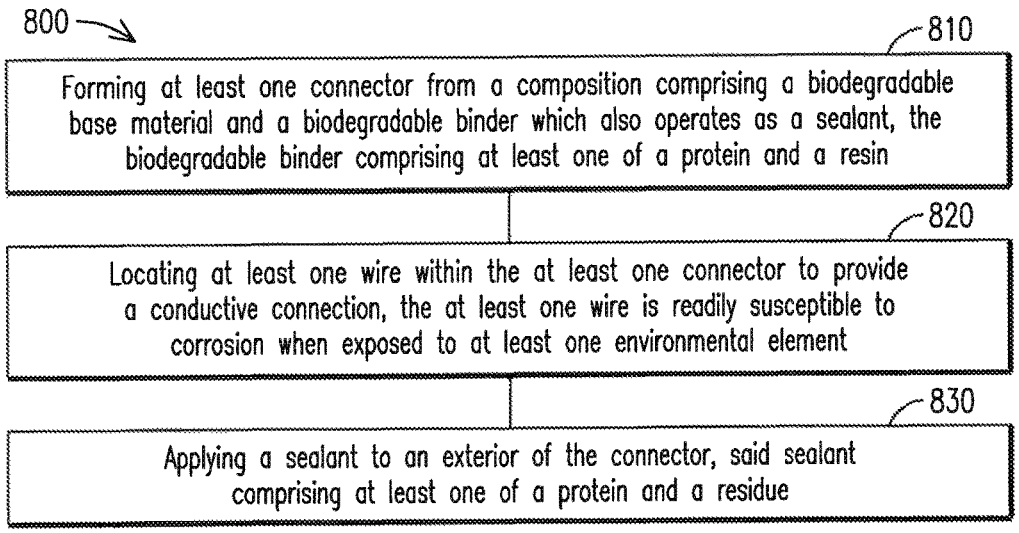
FIG. 8 shows a flowchart illustrating a method of production.

FIG. 8 discloses an embodiment of a method of manufacturing. The method 800 comprises forming at least one connector from a composition comprising a biodegradable base material and a biodegradable binder which also operates as a sealant, the biodegradable binder comprising at least one of a protein and a resin, at 810. Though not limiting, the at least one connector may comprise a first connector element and a second connector element, which may connect to each other. Non-limiting examples of forming may comprise use of a mold injection process, a pneumatic press, a hydraulic press, etc. Thus, a non-limiting example is using compressive forming. This may be performed by placing the binder and base material within a pipe to create the respective connectors when compressed. Other non-limiting configurations of the connector are possible with other shaped molds. The method also comprises inserting at least one wire within the at least one connector to provide a conductive connection, the at least one wire is readily susceptible to corrosion when exposed to at least one environmental element, at 820. Thus, the wire may be through the at least one connector of completely within. The method 800 may also comprise applying a sealant to an exterior of the connector, said sealant comprising at least one of a protein and a residue, at 830.

Figure 9:
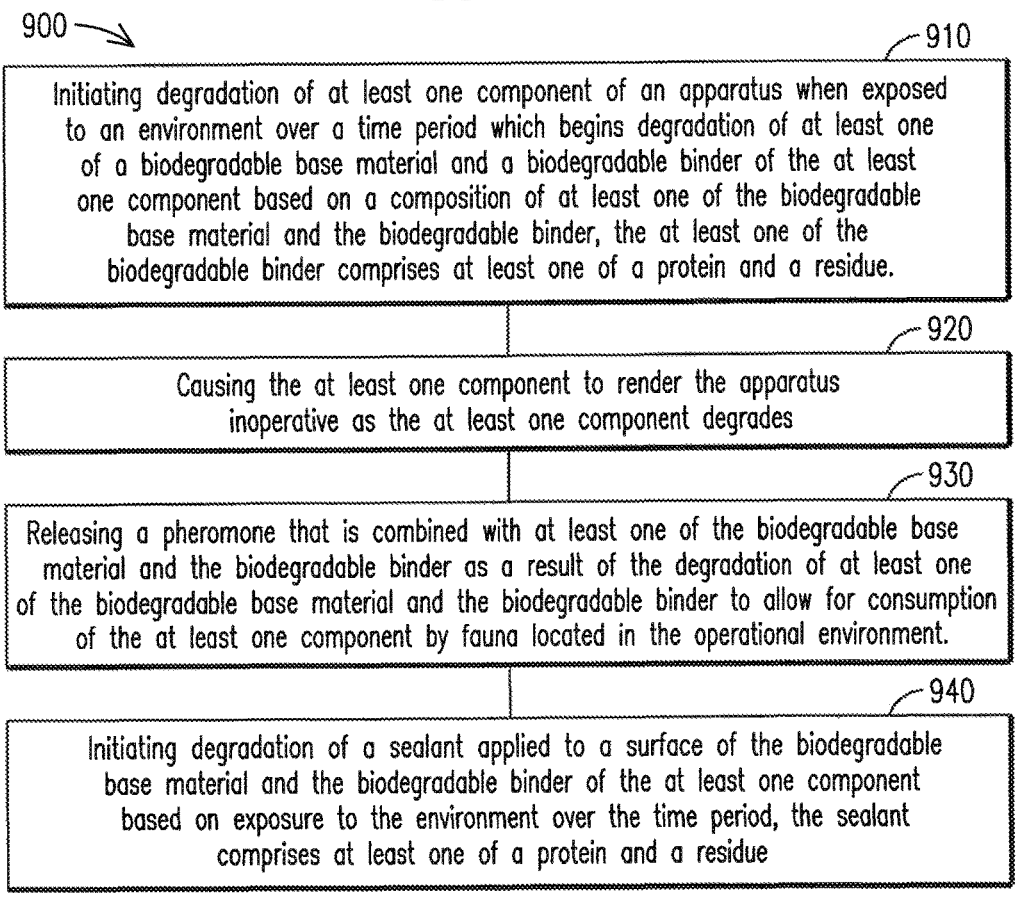
FIG. 9 shows a flowchart illustrating another method of operation.

FIG. 9 is a flowchart illustrating an embodiment of a method. The method 900 comprises initiating degradation of at least one component of an apparatus when exposed to an environment over a time period which begins degradation of at least one of a biodegradable base material and a biodegradable binder of the at least one component based on a composition of at least one of the biodegradable base material and the biodegradable binder, the at least one of the biodegradable binder comprises at least one of a protein and a residue, at 910. The method 900 also comprises causing the at least one component to render the apparatus inoperative as the at least one component degrades, at 920.

The method 900 may also further comprise releasing a pheromone that is combined with at least one of the biodegradable base material and the biodegradable binder as a result of the degradation of at least one of the biodegradable base material and the biodegradable binder to allow for consumption of the at least one component by fauna located in the operational environment, at 930. The method 900 may further comprise initiating degradation of a sealant applied to a surface of the biodegradable base material and the biodegradable binder of the at least one component based on exposure to the environment over the time period, the sealant comprises at least one of a protein and a residue, at 930.

When using an embodiment disclosed herein, at a minimum, electronic connection devices are decomposable in an operational environment (or when exposed to natural elements, such as, but not limited to, water, air, sunlight, and/or biological consumption). As disclosed, the connection may not be an electronic connection that is degradable. Thus, by constructing connectors, or communication channels, from materials which breakdown under the operational environment and/or are consumable by fauna or microorganisms an end result can be achieved which minimizes the physical debris left in the environment after the apparatus, such as, but not limited to, a weapon payload or system, is delivered. The degradable component may not be limited to the connection device, but may also comprise other components of the apparatus, such as, but not limited to, a casing. At a minimum, at least one electronic connection, or communication channel, which is essential to operation of apparatus, is configured as disclosed herein since degradation of the at least one electronic connection or component may result in the apparatus becoming inert.

As such, manufacturers will have the capability to build electronics from materials which will deteriorate and/or dissolve leaving benign residue where the electronics will continue to maintain the current functionality and ruggedness of conventional electronics, but when triggered, be able to degrade partially or completely into their surroundings. From a military perspective, once triggered to dissolve, these electronics would be useless to any enemy who might come across them. Furthermore, if including an explosive component, such electronics will no longer be able to explode, thus not harming non-combatants who may later find the electronics in the operational field.

While various disclosed embodiments have been described above, it should be understood that they have been presented by way of non-limiting examples only. Numerous changes to the disclosed embodiments can be made in accordance with the embodiments herein without departing from the spirit or scope of this disclosure. Thus, the breadth and scope of this disclosure should not be limited by any of the above described embodiments. Rather, the scope of this disclosure should be defined in accordance with the following claims and their equivalents.

Although disclosed embodiments have been illustrated and described with respect to one or more implementations, equivalent alterations and modifications will occur to others skilled in the art upon the reading and understanding of this specification and the annexed drawings. While a particular feature may have been disclosed with respect to only one of several implementations, such a feature may be combined with one or more other features of the other implementations as may be desired and advantageous for any given or particular application.

The terminology used herein is for the purpose of describing particular embodiments only and is not intended to be limiting to the disclosed embodiments. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which the embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Furthermore, while embodiments have been described with reference to various embodiments, it will be understood by those having ordinary skill in the art that various changes, omissions and/or additions may be made and equivalents may be substituted for elements thereof without departing from the spirit and scope of the embodiments. In addition, many modifications may be made to adapt a particular situation or material to the teachings of the embodiments without departing from the scope thereof. Therefore, it is intended that the embodiments not be limited to the particular embodiment disclosed as the best mode contemplated, but that all embodiments falling within the scope of the appended claims are considered. Moreover, unless specifically stated, any use of the terms first, second, etc., does not denote any order or importance, but rather the terms first, second, etc., are used to distinguish one element from another.

What we claim is:

1. An electronic connector, comprising:
   a molded connector body having an applied biodegradable sealant covering the connector body and having an electrical contact within the connector body;
   a biodegradable base material comprising a plant fiber;
   a biodegradable binder material, comprising at least one of a protein and a residue, configured to hold together the base material to form a degradable connector element;

a pheromone combined with at least one of the biodegradable base material and the biodegradable binder material, the pheromone to attract fauna to consume the at least one of the biodegradable base material and the biodegradable binder material based on biological consumption of the degradable connector element by the fauna; and an electrically conductive material to provide an electrical path, the electrically conductive material to conduct an electrical power signal from a power source to an electrical circuit of an apparatus to power the apparatus operating in air;

wherein the degradable connector element affects an operational condition of the apparatus by severing the electrical path and thereby opening the electrical path between the apparatus and the power source in response to degradation of the degradable connector element when the degradable connector element is exposed to environmental elements including sunlight, the air and the biological consumption;

wherein the degradation of the at least one of the biodegradable base material, the biodegradable binder material, and the degradable connector element provide for a limited operational lifespan of the apparatus resulting in the apparatus becoming inoperable by severing the electrical power signal to the apparatus; and wherein the pheromone is released when the degradation of the at least one of the biodegradable base material and the biodegradable binder material occurs.

2. The electronic connector according to claim 1, wherein the degradable connector element comprises a male electrical connector component and a female electrical connector component which are configured to connect to each other for the communication of the electrical power signal wherein the male electrical connector component includes a male connector body, a first wire extending from the male connector body, an electrical contact in the male connector body coupled to the first wire and plugs formed in the male connector body; and the female electrical connector component includes a female connector body, a second wire extending from the female connector body, a second contact in the female connector body coupled to the second wire and sockets formed in the female connector body, a respective one socket configured to tightly fit a respective one plug of the male connector body; and wherein the electrical path passes through the female connector body and the male connector body.

3. The electronic connector according to claim 1, wherein the degradable connector element comprises at least one electrical connector through which the electrical power signal is communicated to an operational element of the apparatus.

4. The electronic connector according to claim 1,
wherein the degradable connector element further comprises an environmentally degradable wire that is further within an operational element connected to the degradable connector element and bridged with the electrically conductive material; and wherein degradation of the environmentally degradable wire renders the operational element further inoperable in response to exposure to the environmental elements.

5. The electronic connector according to claim 4, wherein the environmentally degradable wire comprises an ultrafine wire.

6. The electronic connector according to claim 5, wherein the ultrafine wire comprises powdered metal.

7. The electronic connector according to claim 1, wherein the at least one of the protein and the residue comprises at least one of tree sap, shellac, egg whites, and albumin.

8. The electronic connector according to claim 1, wherein the limited operational lifespan of the apparatus is determinative by a composition of the biodegradable binder material and the biodegradable base material.

9. The electronic connect according to claim 1, further comprising a biodegradable conductive insulation applied to the degradable connector element.

10. The electronic connector according to claim 1, wherein the biodegradable sealant, on the degradable connector element, comprises at least one of the protein and the residue.

11. The electronic connector according to claim 1, wherein the binding material further functions as the sealant of the degradable conductor element.

12. A system, comprising:
an operational element within the system to cause the system to perform a function while the operational element operates in air;

a system element within the system configured to activate and power the operational element with a power signal communicated on an electrical path while the system element operates in air; and a molded connector body having an applied biodegradable sealant covering the connector body and at least one connector element providing for power communication between the operational element and the system element, the at least one connector element comprising a biodegradable base material comprising a plant fiber, a biodegradable binder material, comprised of at least one of a protein and a residue, configured to hold together the base material and form the at least one connector element including a portion of the electrical path to electrically connect the operational element and the system element together; and wherein degradation of at least one of the biodegradable base material, the biodegradable binder material, and the at least one connector element, caused by exposure to environmental elements, provides for a limited operational lifespan of the operational element resulting in the operational element becoming inoperable by severing the electrical path on which the power signal is communicated between the system element and the operation element and thereby opening the electrical path in response to the degradation when exposed to the environmental elements including sunlight, biological consumption, and the air;

wherein the at least one connector element further comprises a pheromone combined with at least one of the biodegradable base material and biodegradable binder material to attract fauna to consume the at least one of the biodegradable base material and biodegradable binder material based on the biological consumption of the at least one connector element by the fauna; and wherein the degradation of the at least one of the biodegradable base material and biodegradable binder material releases the pheromone to attract the fauna.

13. The system according to claim 12, further comprising a biodegradable conductive insulation applied to the at least one connector element.

14. The system according to claim 12, wherein a rate of degradation of the at least one connector element is determinative by a composition of the biodegradable binder material with the biodegradable base material and at least one condition experienced by exposure to the environmental elements.

15. The system according to claim 12, further comprising an environmentally degradable wire connected to at least one of the operational element, the system element, and the at least one connector element wherein degradation of the degradable wire severs the electrical path and renders at least one of the system element and the operational element further inoperable.

16. The system according to claim 12, wherein the at least one of the protein and the residue comprises at least one of a tree sap, shellac, egg whites, and albumin.

17. The system according to claim 12, further comprising an environmentally degradable wire connected to at least one of the operational element,
   wherein the operational element comprises an explosive element and the system element comprises a fuse; and
   wherein degradation of the degradable wire renders at least one of the fuse and explosive element further inoperable for later use.

18. A system, comprising:
   an operational element comprising an explosive element within the system;
   a system element comprising a fuse, the system element within the system configured to activate the operational element; and
   an electrical connector element comprising at least one degradable electrically conductive wire for providing an electrical communication path between the operational element and the system element, an environmentally biodegradable base material, and an environmentally biodegradable binder material, comprised of at least one of a protein and a residue, configured to hold together the base material wherein degradation of at least one of the biodegradable base material, the biodegradable binder material, and the at least one degradable electrically conductive wire, caused by exposure to an operational environment of the system, and degradation of the at least one degradable electrically conductive wire severs the electrical communication path and thereby opens the electrical communication path to render at least one of the fuse and explosive element inoperable, wherein the electrical connector element further includes a pheromone combined with at least one of the biodegradable base material and biodegradable binder material, the pheromone to attract fauna to consume the at least one of the biodegradable base material and biodegradable binder material based on biological consumption of the degradable connector element by the fauna.

19. The system according to claim 12, wherein at least one connector element comprises a male electrical connector component and a female electrical connector component which are configured to connect to each other for the communication of the electrical power signal wherein the male electrical connector component includes a male connector body, a first wire extending from the male connector body, an electrical contact in the male connector body coupled to the first wire and plugs formed in the male connector body; and the female electrical connector component includes a female connector body, a second wire extending from the female connector body, a second contact in the female connector body coupled to the second wire and sockets formed in the female connector body, a respective one socket configured to tightly fit a respective one plug of the male connector body; and wherein the electrical path passes through the female connector body and the male connector body.

* * * * *